United States Patent
Okamoto et al.

(10) Patent No.: US 11,652,185 B2
(45) Date of Patent: May 16, 2023

(54) OPTICAL DEVICE, PHOTOELECTRIC CONVERSION APPARATUS, AND FUEL PRODUCTION APPARATUS

(71) Applicant: Panasonic Intellectual Property Management Co., Ltd., Osaka (JP)

(72) Inventors: Shinya Okamoto, Kyoto (JP); Satoshi Yotsuhashi, Osaka (JP); Taku Hirasawa, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 707 days.

(21) Appl. No.: 16/529,420

(22) Filed: Aug. 1, 2019

(65) Prior Publication Data

US 2019/0355862 A1    Nov. 21, 2019

Related U.S. Application Data

(63) Continuation of application No. PCT/JP2018/031507, filed on Aug. 27, 2018.

(30) Foreign Application Priority Data

Oct. 4, 2017    (JP) .............................. JP2017-194422

(51) Int. Cl.
*H01L 31/10* (2006.01)
*H01L 31/108* (2006.01)
(Continued)

(52) U.S. Cl.
CPC ............ *H01L 31/108* (2013.01); *B82Y 30/00* (2013.01); *C25B 1/04* (2013.01); *C25B 1/55* (2021.01);
(Continued)

(58) Field of Classification Search
CPC . C25B 1/55; H01L 21/6719; H01L 31/02167; H01L 31/022425
See application file for complete search history.

(56) References Cited

U.S. PATENT DOCUMENTS

| | | | |
|---|---|---|---|
| 4,141,020 A | 2/1979 | Howard et al. | |
| 4,310,568 A | 1/1982 | Howard et al. | |

(Continued)

FOREIGN PATENT DOCUMENTS

| | | |
|---|---|---|
| CN | 104662204 A | 5/2015 |
| JP | 53-084464 | 7/1978 |

(Continued)

OTHER PUBLICATIONS

International Search Report of PCT application No. PCT/JP2018/031507 dated Sep. 25, 2018.
(Continued)

*Primary Examiner* — Zulmariam Mendez
(74) *Attorney, Agent, or Firm* — McDermott Will & Emery LLP (57) ABSTRACT

An optical device includes an intermetallic compound of a first metal and a second metal having a lower work function than the first metal, or a solid-solution alloy of the first metal and the second metal and includes an n-type semiconductor in Schottky junction with the intermetallic compound or the solid-solution alloy.

31 Claims, 8 Drawing Sheets

(51) Int. Cl.
*B82Y 30/00* (2011.01)
*H01L 31/0224* (2006.01)
*H01L 31/07* (2012.01)
*C25B 1/04* (2021.01)
*C25B 1/55* (2021.01)
*C25B 9/19* (2021.01)
*C25B 9/73* (2021.01)
*C25B 11/081* (2021.01)

(52) U.S. Cl.
CPC .................. *C25B 9/19* (2021.01); *C25B 9/73* (2021.01); *C25B 11/081* (2021.01); *H01L 31/022408* (2013.01); *H01L 31/07* (2013.01)

(56) References Cited

U.S. PATENT DOCUMENTS

| | | | |
|---|---|---|---|
| 5,461,246 | A | 10/1995 | Chou |
| 2004/0253501 | A1 | 12/2004 | Ohtani et al. |
| 2009/0008735 | A1 | 1/2009 | Ogino et al. |
| 2009/0134486 | A1* | 5/2009 | Fujikata .......... H01L 31/022408 257/E31.093 |
| 2010/0175745 | A1 | 7/2010 | Kostecki et al. |
| 2011/0204383 | A1 | 8/2011 | Yamamoto et al. |
| 2011/0272771 | A1 | 11/2011 | Briceno |
| 2014/0318596 | A1 | 10/2014 | Juluri et al. |
| 2015/0111118 | A1 | 4/2015 | Nomura et al. |
| 2015/0243443 | A1 | 8/2015 | Kozawa et al. |
| 2016/0372757 | A1 | 12/2016 | Kim et al. |

FOREIGN PATENT DOCUMENTS

| | | |
|---|---|---|
| JP | 61-244076 A | 10/1986 |
| JP | 2001-320072 A | 11/2001 |
| JP | 2009-038352 | 2/2009 |
| JP | 2009-070768 A | 4/2009 |
| JP | 2010-021189 | 1/2010 |
| JP | 2011-176015 | 9/2011 |
| JP | 2013-049891 | 3/2013 |
| JP | 2013-115418 | 6/2013 |
| JP | 2013-250303 | 12/2013 |
| JP | 2014-067988 | 4/2014 |
| JP | 2015-002144 | 1/2015 |
| JP | 2015-502658 | 1/2015 |
| JP | 2015-098643 | 5/2015 |
| JP | 2016-162890 | 9/2016 |
| JP | 2016-530676 | 9/2016 |
| WO | 2003/028134 A1 | 4/2003 |
| WO | 2010/067398 | 6/2010 |
| WO | 2013/151142 | 10/2013 |

OTHER PUBLICATIONS

Mark W. Knight et al., "Photodetection with Active Optical Antennas", Science, vol. 332, Apr. 28, 2011, pp. 702-704.

Marco Valenti et al., "Hot Carrier Generation and Extraction of Plasmonic Alloy Nanoparticles", ACS Photonics 2017, 4, Mar. 6, 2017, pp. 1146-1152.

English Translation of Chinese Search Report dated Jan. 18, 2023 for the related Chinese Patent Application No.201880005587.1.

A.Goswami. et al, "Fabrication of substrate supported bimetallic nanoparticles and their optical characterization through reflection spectra", Superlattices and Microstructures, Jan. 18, 2016, pp. 252-258.

* cited by examiner

OPTICAL DEVICE, PHOTOELECTRIC CONVERSION APPARATUS, AND FUEL PRODUCTION APPARATUS

BACKGROUND

1. Technical Field

The present disclosure relates to an optical device, a photoelectric conversion apparatus, and a fuel production apparatus.

2. Description of the Related Art

A photoelectric conversion technology that exploits surface plasmon resonance in a Schottky structure in which a metal nanostructure is arranged on a semiconductor has attracted attention. Electrons in a temporary high-energy state due to surface plasmon resonance are called hot electrons. When hot electrons cross a Schottky barrier between the metal and the semiconductor, charge separation occurs and photoelectric conversion is realized. An element in which a metal nanostructure is disposed on a semiconductor has attracted attention also in the field of photocatalysts.

Japanese Unexamined Patent Application Publication No. 2016-162890 and Japanese Unexamined Patent Application Publication No. 2014-67988 disclose examples of a photoelectric conversion method using an element in which metal nanoparticles having surface plasmon resonance absorbency are arranged on an n-type semiconductor.

Mark W. Knight, Heidar Sobhani, Peter Nordlander, and Naomi J. Halas, "Photodetection with Active Optical Antennas", Science, Vol. 332, p. 702-704, 2011 discloses a photoelectric conversion method using a Schottky element in which a metal film having a low work function and a metal film having surface plasmon resonance absorbency are disposed on an n-type semiconductor.

SUMMARY

One non-limiting and exemplary embodiment provides an optical device capable of improving sensitivity.

In one general aspect, the techniques disclosed here feature an optical device that includes an intermetallic compound of a first metal and a second metal having a lower work function than the first metal or that includes a solid-solution alloy of the first metal and the second metal, and that includes an n-type semiconductor in Schottky junction with the intermetallic compound or the solid-solution alloy.

General or specific embodiments of the present disclosure may be implemented as a device, an apparatus, a system, a method, or any selective combination thereof.

According to embodiments of the present disclosure, cost can be reduced.

Additional benefits and advantages of the disclosed embodiments will become apparent from the specification and the drawings. The benefits and/or advantages may be individually obtained by the various embodiments and features of the specification and the drawings, which need not all be provided to obtain one or more of such benefits and/or advantages.

DETAILED DESCRIPTION

Underlying Knowledge Forming Basis of Present Disclosure

Before the embodiments according to the present disclosure are described, findings of the present inventors will be described.

Semiconductor photodetectors now in widespread use exploit photoelectric conversion based on light absorption due to interband transition. Consequently, it is difficult to detect light having energy lower than or equal to the band gap energy of the semiconductor. Realization of photoelectric conversion in a wider wavelength range than semiconductor photodetectors in the related art has been desired.

For example, it is desirable to realize an inexpensive photodetector capable of detecting light in the near-infrared range (hereafter referred to as "near-infrared light") with high sensitivity. Exploitation of the near-infrared light may enable imaging with high sensitivity to be performed at any time of day or night. Further, near-infrared light is very safe for the eye. Therefore, it is desirable that a photodetector in the near-infrared light range be utilized as a sensor to facilitate autonomous driving of automobiles.

Regarding light in the visible range, a photodetector using silicon (Si) is relatively inexpensive and in widespread use. Regarding the near-infrared range, a semiconductor having lower band gap energy may be used. Examples of the semiconductor having low band gap energy include indium gallium arsenide (InGaAs).

Meanwhile, a photoelectric conversion technology in which a metal nanostructure has a Schottky structure arranged on a semiconductor, as disclosed in Japanese Unexamined Patent Application Publication Nos. 2016-162890 and 2014-67988, has attracted attention. When electrons generated by surface plasmon resonance cross a Schottky barrier in the metal nanostructure, charge separation occurs and photoelectric conversion is realized. This technology has attracted attention in the fields of not only photoelectric conversion but also photocatalysts as a method for exploiting light in a wide wavelength range, which has previously been difficult-to-apply.

A metal which has excellent plasmonic characteristics, for example, gold (Au), may be used for the metal nanostructure. However, the work function of the metal having excellent plasmonic characteristics is high, and a Schottky barrier generated at the interface of the semiconductor increases. Consequently, hot electrons do not readily cross the Schottky barrier.

In "Mark W. Knight et al.", a way of lowering the Schottky barrier has been devised, and titanium (Ti), which is a metal having a relatively low work function, is disposed between a semiconductor substrate and Au, which is a metal having excellent plasmonic characteristics.

However, according to the technology disclosed in "Mark W. Knight et al.", it is necessary that Ti and Au serving as adhesion layers be sequentially formed in a vacuum and, thereafter, a structure to induce plasmon resonance be micromachined. A high-quality thin-film-forming technology and electron-beam lithography are required and, therefore, process costs increase to a great extent. To produce at a lower cost, realization of an optical device that can be synthesized in bulk by a method, for example, a nanoink-coating process, is desired. In addition, according to the technology disclosed in "Mark W. Knight et al.", since the plasmonic characteristics of the Ti film are low, the plasmon absorption characteristics of the metal nanostructure on the semiconductor substrate are degraded and the sensitivity and the photoelectric conversion efficiency are decreased.

A method in which a nanoparticle having a core-shell structure that is produced by covering a metal core having excellent plasmonic characteristics with a metal shell having a relatively low work function is formed on a semiconductor is also considered. However, the metal shell having a low work function is readily oxidized, even in air. Therefore, it is difficult to lower the Schottky barrier by using nanoparticles having such a core-shell structure.

The present inventors found the above-described problems and devised a new optical device to address the problems. The optical devices according to the embodiments of the present disclosure address the problems by using nanoparticles including an alloy portion containing a first metal and a second metal having a lower work function than the first metal (hereafter also referred to as "alloy nanoparticles"). The first metal may be, for example, a metal having excellent plasmonic characteristics and having a low ionization tendency. Arrangement of the alloy nanoparticles containing the first metal and the second metal on the semiconductor ensures compatibility between formation of hot electrons with high efficiency and extraction of current with a low Schottky barrier. Consequently, a photoelectric conversion device with improved photoelectric conversion efficiency can be provided.

The exemplary embodiments according to the present disclosure will be described below with reference to the drawings. In this regard, detailed descriptions may be omitted. For example, detailed descriptions of well-known items may be omitted. Further, substantially the same configurations are indicated by the same reference numerals and duplicate explanations may be omitted. This is to avoid redundant repetition of the following explanations for the sake of facilitating understanding by a person skilled in the art. The present inventors provided the attached drawings and the following explanations for the sake of facilitating sufficient understanding of the present disclosure by a person skilled in the art. However, the drawing and the embodiments are not intended to limit the scope of the claims.

First Embodiment: Schottky Device

An embodiment of a Schottky device will be described as an example of the optical device.

Figure 1A:
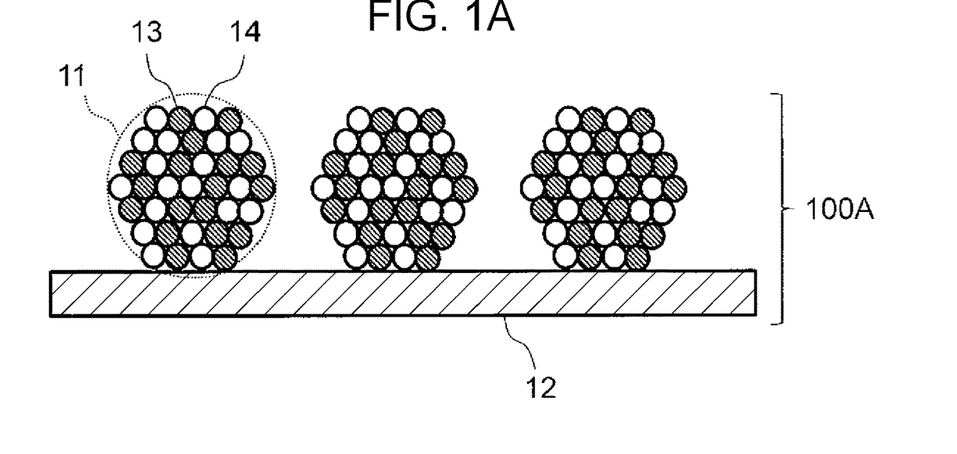
FIG. 1A is a schematic diagram showing an example of a Schottky device according to an embodiment of the present disclosure.

FIG. 1A is a schematic diagram showing an example of a Schottky device 100A according to an exemplary embodiment of the present disclosure. The Schottky device 100A includes a plurality of alloy nanoparticles 11 and an n-type semiconductor 12. The plurality of alloy nanoparticles 11 are in contact with a substrate composed of the n-type semiconductor 12. The alloy nanoparticle 11 contains a first metal 13 and a second metal 14. The first metal 13 has excellent plasmonic characteristics and a low ionization tendency. The second metal 14 has a lower work function than the first metal 13.

According to the above-described configuration, natural oxidation of the second metal 14 having a relatively low work function can be suppressed, and the Schottky barrier can be lowered. Consequently, an optical device capable of performing photoelectric conversion with high efficiency can be realized at a relatively low cost.

In the Schottky device 100A, each alloy nanoparticle 11 is arranged on the n-type semiconductor 12. The electron affinity of the n-type semiconductor 12 is lower than the work function of the second metal 14. Consequently, each alloy nanoparticle 11 is in Schottky junction with the n-type semiconductor 12.

The first metal 13 may be composed of a material having high electrical conductivity, excellent plasmonic characteristics, and a low ionization tendency. The first metal 13 may be, for example, at least one metal selected from a group consisting of gold (Au), silver (Ag), copper (Cu), and aluminum (Al).

The second metal 14 may be composed of a material having a lower work function than the first metal 13. The second metal may be at least one metal selected from a group consisting of titanium (Ti), chromium (Cr), silver (Ag), copper (Cu), aluminum (Al), nickel (Ni), manganese (Mn), iron (Fe), zinc (Zn), gallium (Ga), and tantalum (Ta).

In the present disclosure, "particle diameter" denotes the diameter of a circle that circumscribes a particle in a microscopy image including an image of the particle. Hereafter the particle diameter may be referred to as "size". In addition, in the present disclosure, "nanoparticle" denotes a particle having a size on the order of nanometers (nm) that is sufficiently less than the wavelength of light (represented by visible light or near-infrared light) used. That is, "nanoparticle" denotes a particle having a particle diameter of about 1 nm or more and less than 1 μm. The size of the alloy nanoparticle 11 may be, for example, 1 nm or more and 200 nm or less. The size of the alloy nanoparticle 11 may be desirably 1 nm or more and 50 nm or less and further desirably 5 nm or more and 20 nm or less. Plasmon absorption can be improved by setting the size of the alloy nanoparticle 11 to be 200 nm or less. Meanwhile, for example, a microscopy image including images of at least 10 alloy nanoparticles 11 may be acquired, and an arithmetic average of the sizes of the at least 10 alloy nanoparticles 11 may be determined on the basis of the microscopy image. The resulting arithmetic average may be 1 nm or more and 200 nm or less, 1 nm or more and 50 nm or less, or 5 nm or more and 20 nm or less. The size of the alloy nanoparticle 11 may be measured by an electron microscope, for example, a transmission electron microscope (TEM) or a scanning electron microscope (SEM).

Figure 4:
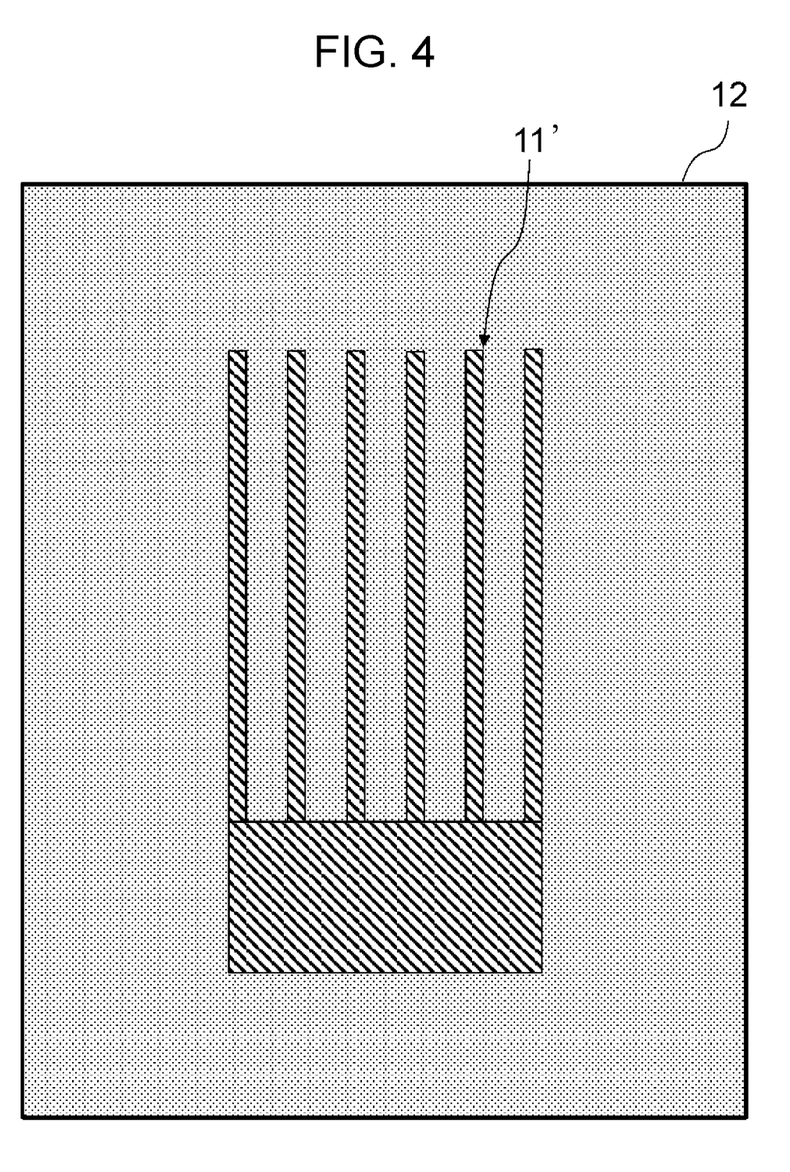
FIG. 4 is a diagram showing another shape of an alloy.

The alloy nanoparticle 11 has surface plasmon resonance absorbency. The surface plasmon resonance wavelength of the alloy nanoparticle 11 can be adjusted by changing any of the particle diameter, the shape, and the structure of the alloy nanoparticle 11 and the composition of the alloy. In addition to the spherical structure shown in FIG. 1A, the alloy nanoparticle 11 may have various structures or shapes, for example, a core-shell structure that will be described later, a wire structure elongated in a particular direction, and a substantially cubic structure. An example in which the alloy nanoparticle 11 is used will be described below, but the shape of the alloy is not limited to a nanoparticle. For example, as shown in FIG. 4, instead of the alloy nanoparticle 11, an alloy 11' that is composed of the same material as the alloy nanoparticle 11 and that has a comb-like structure may be arranged in contact with the n-type semiconductor 12. In the example shown in FIG. 1A, the entire alloy nanoparticle 11 is composed of the alloy of the first metal 13 and the second metal 14. However, only part of the alloy nanoparticle 11 may be the alloy containing the first metal 13 and the second metal 14 as in the core-shell structure described later, for example.

The alloy nanoparticle 11 according to the present embodiment contains, for example, an intermetallic compound of the first metal 13 and the second metal 14. Whether the intermetallic compound is contained in the alloy nanoparticle 11 can be determined on the basis of, for example, whether the peak position obtained by X-ray diffraction measurement of the alloy nanoparticle 11 is in accord with the peak position of X-ray diffraction of an intermetallic compound described in the literature, for example, in a technical book. In the case in which the composition ratio of the intermetallic compound contained in the alloy nanoparticle 11 is different from the composition ratio of the intermetallic compound described in the literature, the peak positions of the composition ratios are slightly different from each other (that is, there is a peak shift). In this case, the lattice spacing is determined from the lattice image obtained by nanostructure analysis of the alloy nanoparticle 11 by using a scanning transmission electron microscope (STEM). Whether an intermetallic compound is contained may be determined on the basis of whether the peak position calculated from the resulting lattice spacing is in accord with the peak position described in the literature. Alternatively, the composition ratio of the alloy nanoparticle 11 is determined by energy-dispersive X-ray analysis (EDX), and the lattice spacing is calculated on the basis of Vegard's law. Whether the intermetallic compound is contained may be determined on the basis of whether the peak position calculated from the resulting lattice spacing is in accord with the peak position described in the literature.

Meanwhile, in the alloy nanoparticle 11 according to the present embodiment, the first metal 13 and the second metal 14 may be in a solid solution state at the atomic level. The solid solution state of the first metal 13 and the second metal 14 refers to the state in which part of the crystal of the first metal 13 is substituted with the second metal 14. That is, the alloy nanoparticle 11 may contain a solid-solution alloy in which part of the crystal of the first metal 13 is substituted with the second metal 14. Whether the alloy nanoparticle 11 contains a solid-solution metal can be determined by, for example, the method described below. That is, when (1) a peak shift is observed between the peak position obtained by X-ray diffraction measurement of the alloy nanoparticle 11 and the peak position of X-ray diffraction of a simple metal described in the literature, for example, in a technical book, and (2) an element mapping that reflects the composition ratio of a plurality of types of metal atoms is observed in a cross section of the alloy nanoparticle 11 by EDX and line analysis, it can be said that the alloy nanoparticle 11 contains a solid-solution metal. In addition, It is also determined that the alloy nanoparticle 11 contains a solid-solution metal when no phase separation of the alloy nanoparticle is observed on the basis of element mapping by using STEM and an X-ray diffraction method.

The solid solution containing the first metal 13 and the second metal 14 may contain other metals. The composition ratio of the first metal 13 to the second metal 14 in an alloy portion in the solid solution state may be appropriately adjusted in accordance with necessary characteristics. The alloy nanoparticle 11 according to the present embodiment contains the first metal 13 in a higher proportion than that of the second metal 14. That is, the amount of the first metal 13 contained in the alloy nanoparticle 11 is larger than the amount of the second metal 14 contained tin the alloy nanoparticle 11. In other embodiments, the alloy nanoparticle 11 may contain the second metal 14 in a higher proportion than that of the first metal 13. In the following description, the first metal 13 is set to be a solvent metal, and the second metal 14 is set to be a solute metal.

The plasmonic characteristics of the alloy nanoparticle 11 mainly reflect the characteristics of the solute metal 13 that makes up a large proportion. Meanwhile, the Schottky barrier can be lowered and the current extraction efficiency can be improved by the solute metal 14 having a low work function. As a result, compared with the case in which the solute metal 14 is not present, a considerable improvement in performance can be realized.

The electron affinity of the n-type semiconductor 12 is lower than the work function of the alloy nanoparticle 11, and the Schottky junction is realized between the n-type semiconductor 12 and the alloy nanoparticle 11. In this case, the Schottky device 100A exhibits rectification characteristics.

The wavelength corresponding to the band gap energy of the n-type semiconductor 12 may be smaller than the surface plasmon resonance wavelength of the alloy nanoparticle 11. In other words, the energy of the light that causes surface plasmon resonance of the alloy nanoparticle 11, that is, the energy of applied light, may be lower than the band gap energy of the n-type semiconductor 12. Even in the case where the energy of applied light is lower than the band gap energy of the n-type semiconductor 12, charge separation occurs as long as generated hot electrons cross a Schottky barrier.

The n-type semiconductor 12 may contain, for example, at least one selected from a group consisting of a silicon (Si) semiconductor, a germanium (Ge) semiconductor, and a gallium arsenide (GaAs) semiconductor. Alternatively, the n-type semiconductor 12 may be a Si semiconductor, a Ge semiconductor, or a GaAs semiconductor. In this case, the surface plasmon resonance wavelength of the alloy nanoparticle 11 may be, for example, 900 nm or more. The n-type semiconductor 12 may be a wide gap semiconductor. The wide gap semiconductor may contain at least one selected from a group consisting of a titanium oxide ($TiO_2$) semiconductor, a gallium nitride (GaN) semiconductor, and a strontium titanate ($SrTiO_3$) semiconductor. Alternatively, the wide gap semiconductor may be a titanium oxide ($TiO_2$) semiconductor, a gallium nitride (GaN) semiconductor, or a strontium titanate ($SrTiO_3$) semiconductor. In the case in which the n-type semiconductor 12 is the wide gap semiconductor, the surface plasmon resonance wavelength of the alloy nanoparticle 11 may be, for example, 400 nm or more.

To date, regarding light with a wavelength of 900 nm or less, a Si semiconductor, for which a technology to produce a high-quality crystal has been established, has been used, and detection of such light with high sensitivity has been realized. Regarding the near-infrared light, which is light with energy lower than or equal to the band gap energy of the Si semiconductor, an InGaAs semiconductor epitaxially grown on an InP single-crystal substrate has been used, and high sensitivity has been realized. Production of the InGaAs semiconductor requires a high degree of thin-film formation technology. According to the present embodiment, the light in the near-infrared range can be detected in the case in which the Si semiconductor, the Ge semiconductor, the GaAs semiconductor, or the wide gap semiconductor is used. In addition, these semiconductors do not require a high degree of thin-film formation technology for production and, therefore, cost can be reduced. In particular, in the case in which the Si semiconductor is used, a dark current can be reduced compared with the case in which the InGaAs semiconductor is used.

Meanwhile, as disclosed in "Mark W. Knight et al.", the structure in which a metal film having a low work function is disposed between an n-type semiconductor substrate and a metal so as to cause surface plasmon resonance is known. However, in contrast to the present embodiment, no attempt to alloy the first metal 13 causing surface plasmon resonance and the second metal 14 having a low work function has been made. Adoption of the structure described in the present embodiment enables a photoelectric conversion device with high efficiency to be produced by a simple method, for example, a nanoink-coating process.

Figure 1B:
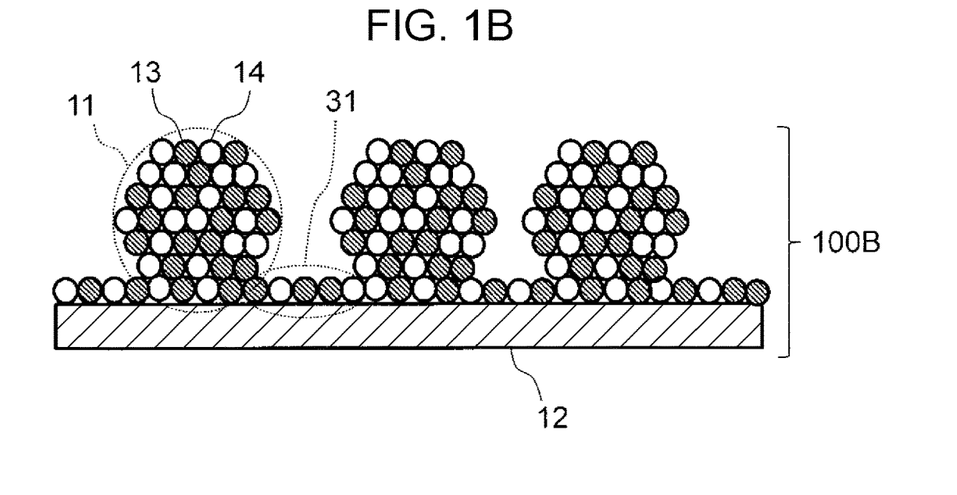
FIG. 1B is a schematic diagram showing a Schottky device according to a modified example.

FIG. 1B is a schematic diagram showing a Schottky device 100B according to a modified example of the present embodiment. In addition to the structure shown in FIG. 1A, the Schottky device 100B further includes a metal film 31 that physically and electrically connects a plurality of alloy nanoparticles 11 to each other. The metal film 31 in this example contains the first metal 13 and the second metal 14. The metal film 31 covers at least part of the surface of the n-type semiconductor.

Figure 1C:
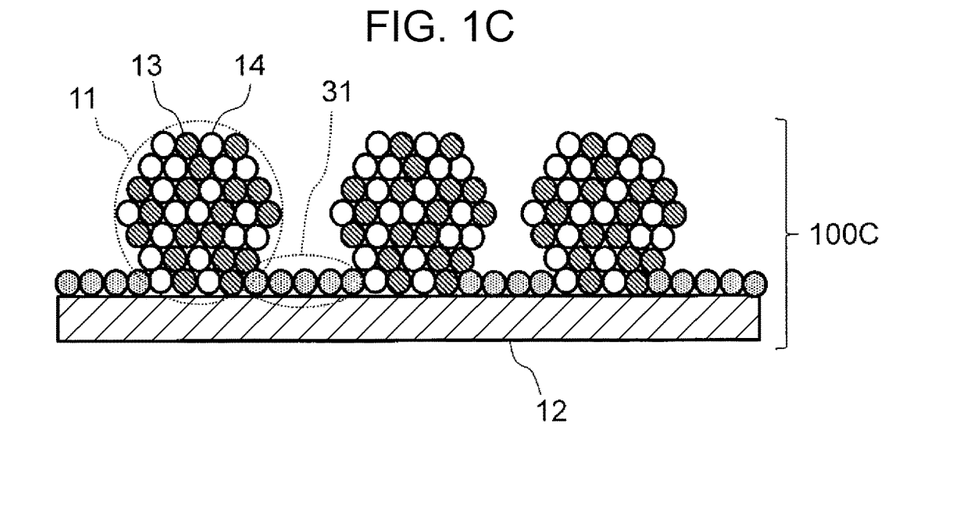
FIG. 1C is a schematic diagram showing a Schottky device according to another modified example.
Figure 3A:
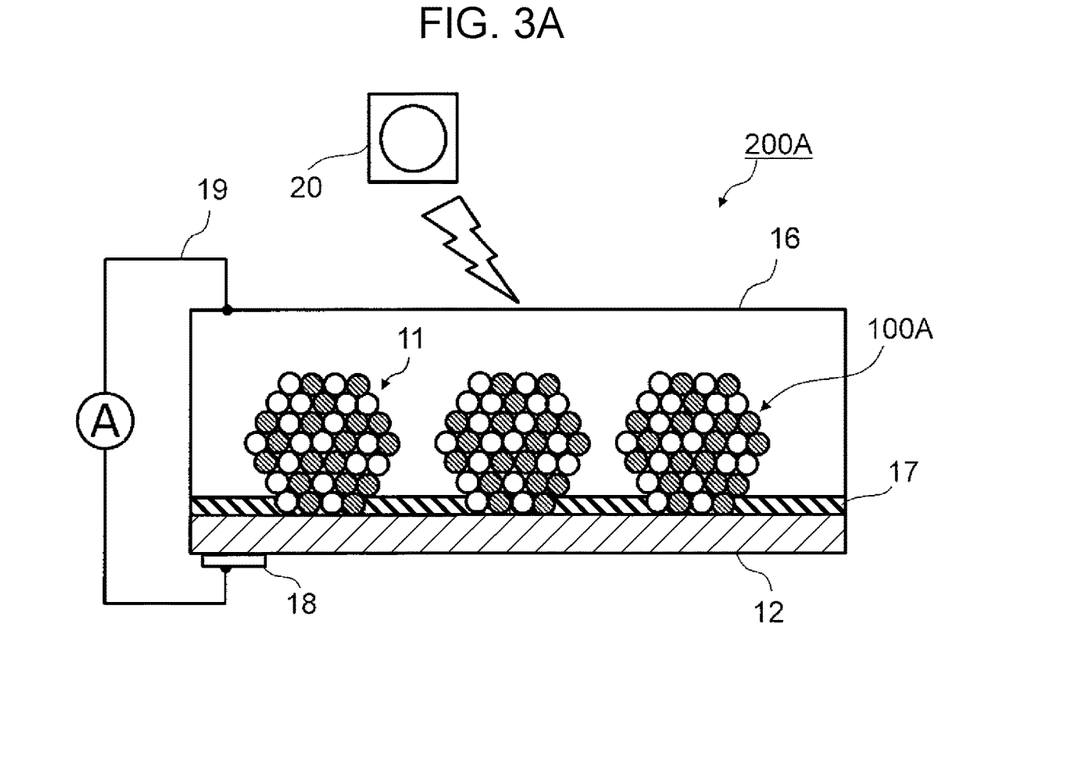
FIG. 3A is a schematic diagram showing the configuration of a photoelectric conversion apparatus including the Schottky device shown in FIG. 1A.

FIG. 1C is a schematic diagram showing a Schottky device 100C according to another modified example of the present embodiment. The Schottky device 100C in this example is different from the configuration shown in FIG. 1B in that the metal film 31 is composed of a metal material different from the first metal 13 or the second metal 14. As long as the metal film 31 has electrical conductivity, the metal film 31 is not limited to being an alloy. In the examples shown in FIG. 1B and FIG. 1C, the metal film 31 plays a role as a circuit. In contrast to the configuration shown in FIG. 1A, a transparent conductive film and an insulating layer that will be described later with reference to FIG. 3A are not essential. As a result, the process for producing the photoelectric conversion device can be simplified.

Figure 1D:
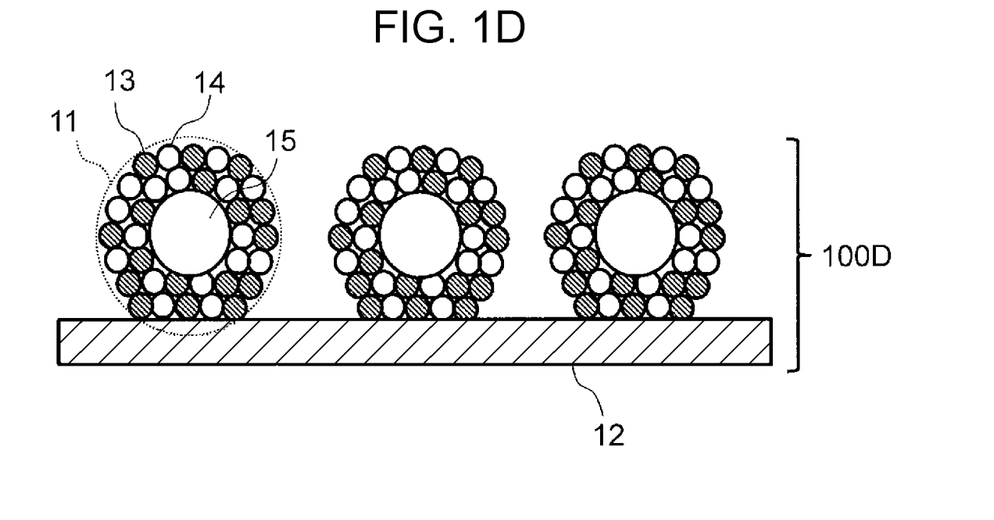
FIG. 1D is a schematic diagram showing a Schottky device according to another modified example.

FIG. 1D is a schematic diagram showing a Schottky device 100D according to another modified example of the present embodiment. The Schottky device 100D is different from the configuration shown in FIG. 1A in that the alloy nanoparticle 11 has a core-shell structure. The alloy nanoparticle 11 in this example includes a core portion 15 and an alloy portion covering at least part of the circumference of the core portion 15. The core portion 15 may be composed of, for example, at least one material selected from a group consisting of the first metal, a polymer material, silica, and air. The alloy portion is a solid solution of the first metal 13 and the second metal 14 and covers part of or the entire circumference of the core portion 15.

The core portion 15 may be any of gold (Au), silver (Ag), copper (Cu), and aluminum (Al). In this case, essentially high plasmonic characteristics can be provided because a significant influence is not exerted by alloying.

The core portion 15 may be a polymer material, for example, polystyrene or silica, or a cavity. In this case, the surface plasmon resonance wavelength can be increased by an interaction between the inner shell (that is, the core portion 15) of the core-shell structure and a surface plasmon of the outer shell (that is, the alloy portion).

Figure 1E:
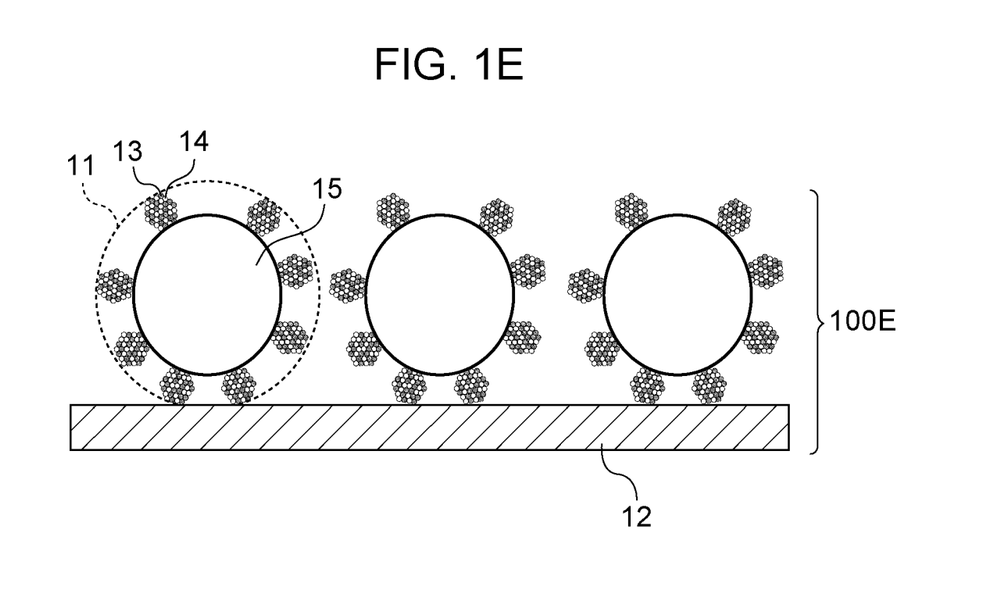
FIG. 1E is a schematic diagram showing a Schottky device according to another modified example.

FIG. 1E is a schematic diagram showing a Schottky device 100E according to another modified example of the present embodiment. The Schottky device 100E shown in FIG. 1E also includes a core portion 15 and a peripheral alloy portion. In contrast to the example shown in FIG. 1D, the alloy portion covers only part of the core portion 15. In this example, a plurality of alloy portions are distributed, with gaps therebetween, around the core portion 15 having a relatively large size (for example, several tens of nanometers to several hundreds of nanometers). In this example, the size of the core portion 15 may be, for example, 200 nm or less. Each of the plurality of alloy portions may be a solid solution of the first metal 13 and the second metal 14. The material for forming the core portion 15 may be the first metal. In the case in which the core portion 15 is gold (Au), silver (Ag), or copper (Cu), essentially high plasmonic characteristics can be provided because no influence is exerted by alloying.

Next, examples of arrangement of the plurality of alloy nanoparticles 11 will be described with reference to FIGS. 2A to 2C.

Figure 2A:
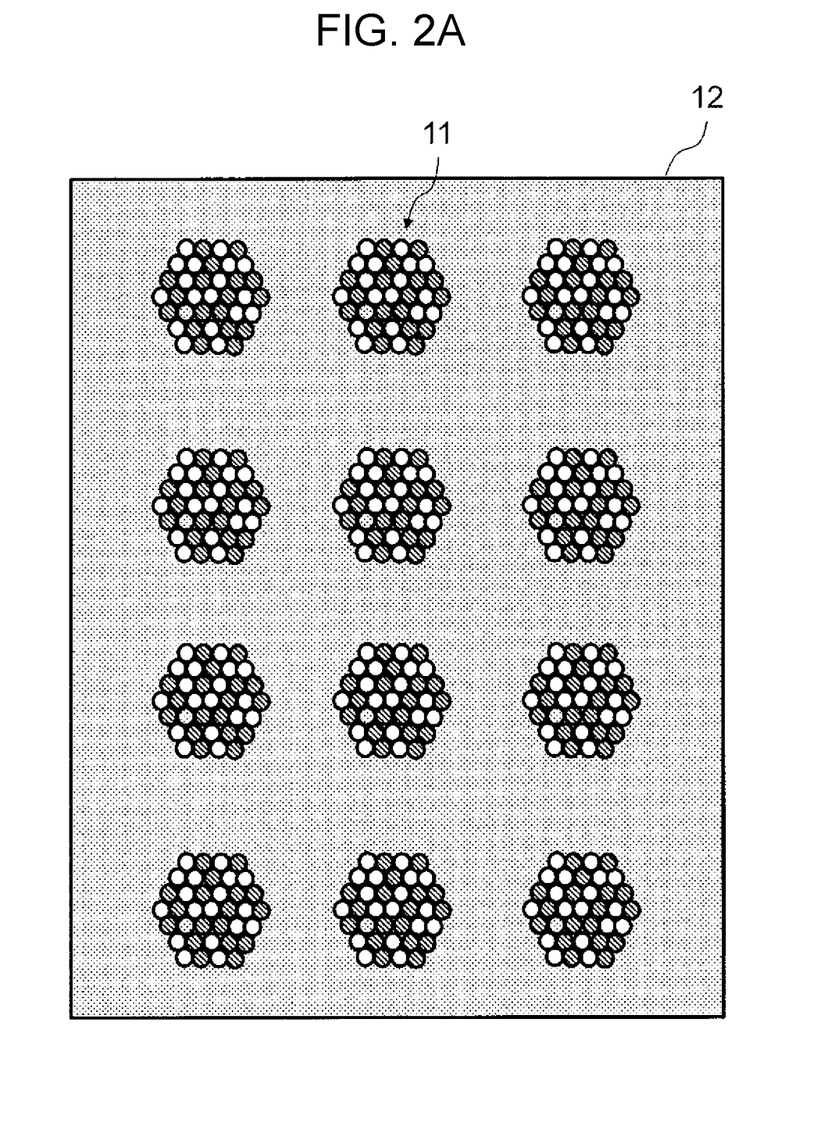
FIG. 2A is a top view showing an arrangement example of a plurality of alloy nanoparticles in the Schottky device shown in FIG. 1A.

FIG. 2A is a top view showing an arrangement example of the plurality of alloy nanoparticles 11 in the Schottky device 100A shown in FIG. 1A. As shown in this example, the plurality of alloy nanoparticles 11 may be two-dimensionally and periodically arranged. The plurality of alloy nanoparticles 11 may be one-dimensionally arrayed. There is no particular limitation regarding the periodicity of the arrangement of the plurality of alloy nanoparticles 11. For example, the period may be set to be about double the size of the particle.

Figure 2B:
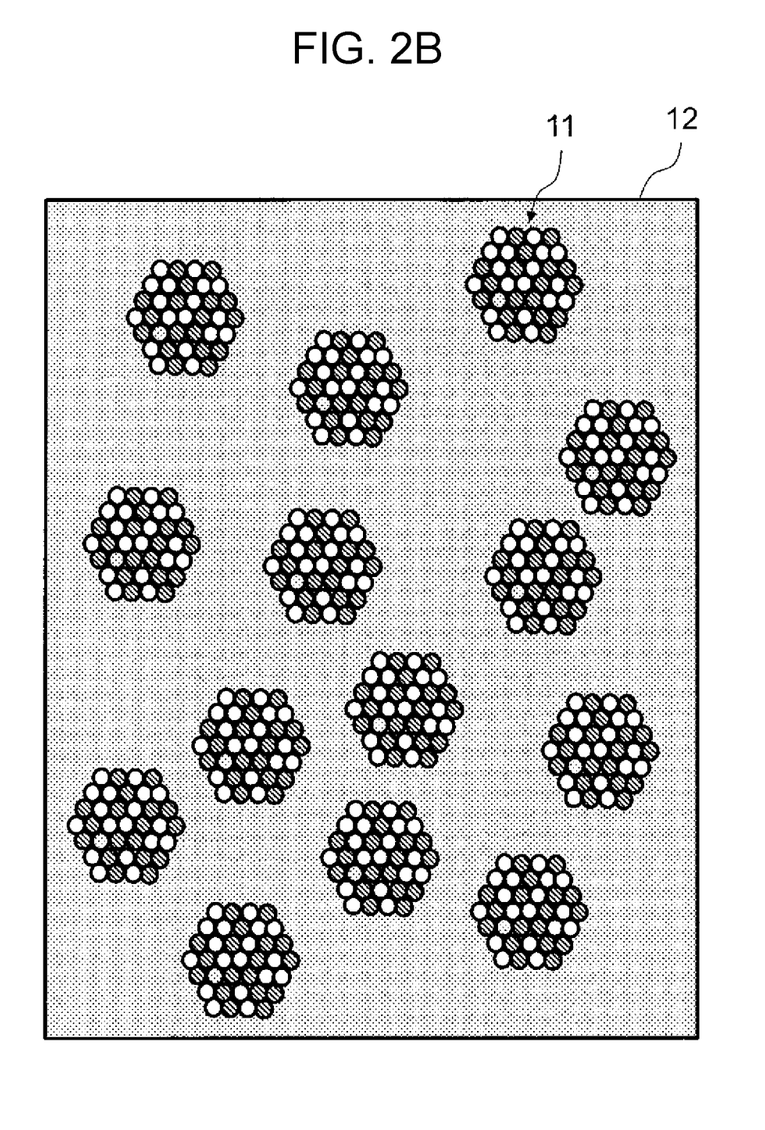
FIG. 2B is a top view showing another arrangement example of a plurality of alloy nanoparticles in the Schottky device shown in FIG. 1A.

FIG. 2B is a top view showing another arrangement example of the plurality of alloy nanoparticles 11 in the Schottky device 100A shown in FIG. 1A. The plurality of alloy nanoparticles 11 in this example do not have clear periodicity and are arranged randomly or pseudorandomly. Even when such an arrangement is adopted, the effect of the present embodiment is obtained without problems.

Likewise, the arrangements shown in FIG. 2A and FIG. 2B may be adopted in the configurations shown in not only FIG. 1A but also FIG. 1B to FIG. 1E.

Figure 2C:
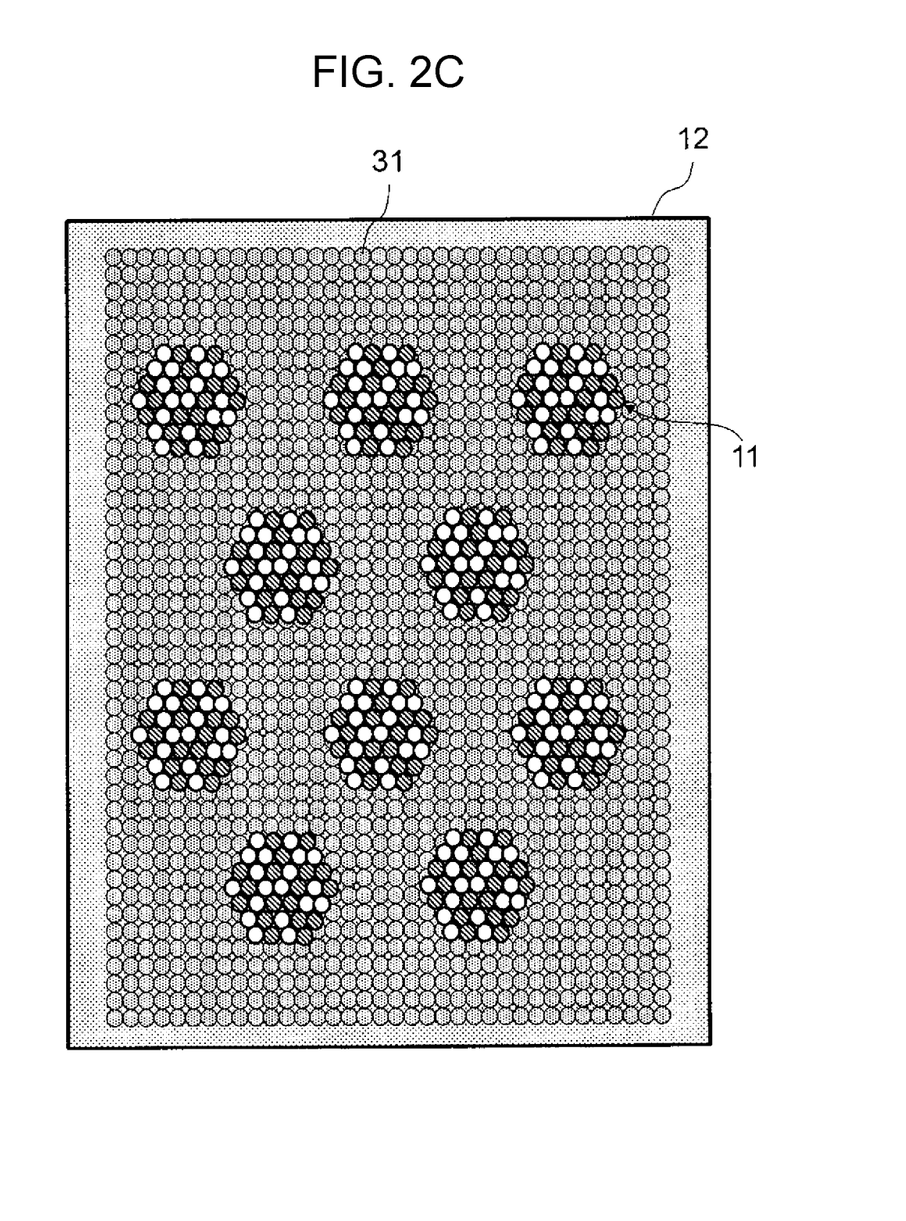
FIG. 2C is a top view showing an arrangement example of a plurality of alloy nanoparticles in the Schottky device shown in FIG. 1B or the Schottky device shown in FIG. 1C.

FIG. 2C is a top view showing an arrangement example of the plurality of alloy nanoparticles 11 in the Schottky device 100B shown in FIG. 1B or in the Schottky device 100C shown in FIG. 1C. As shown in the drawing, the metal film 31 is arranged on the n-type semiconductor 12 so as to surround the plurality of alloy nanoparticles 11. Consequently, the plurality of alloy nanoparticles 11 are electrically connected to each other.

In this regard, the structures of the plurality of alloy nanoparticles 11 are not necessarily uniform. The sizes and the shapes may be different from each other. Further, the effect of the present embodiment is also obtained in the case in which only one alloy nanoparticle 11 is disposed.

Second Embodiment: Photoelectric Conversion Device

Next, an embodiment of a photoelectric conversion device including a Schottky device will be described.

FIG. 3A is a schematic diagram showing the configuration of a photoelectric conversion apparatus 200A including the Schottky device 100A shown in FIG. 1A. A current is generated by applying light to the photoelectric conversion device 200A from a light source 20.

The photoelectric conversion device 200A includes the Schottky device 100A serving as an optical device, an ohmic electrode 18 (also referred to as a first electrode) in contact with the surface of the n-type semiconductor 12 opposite to the surface on which the alloy nanoparticles 11 are located, and a conducting wire 19 electrically connecting the ohmic electrode 18 to the alloy nanoparticles 11. The photoelectric conversion device 200A further includes, on the n-type semiconductor 12, an insulating film 17 disposed on the surface provided with the alloy nanoparticles 11 and a transparent conductive film 16 on the insulating film 17. The transparent conductive film 16 envelops the alloy nanoparticles 11. The transparent conductive film 16 is not in contact with the n-type semiconductor 12. The conducting wire 19 electrically connects the ohmic electrode 18 to the transparent conductive film 16.

The photoelectric conversion device 200A is produced by providing the Schottky device 100A with the insulating film 17, the transparent conductive film 16, the ohmic electrode 18, and the conducting wire 19. The insulating film 17 is formed in a region not provided with the plurality of alloy nanoparticles 11 on the n-type semiconductor 12. The transparent conductive film 16 is formed on the insulating film 17. The ohmic electrode 18 is formed on the back surface of the n-type semiconductor 12. The n-type semiconductor 12 is electrically isolated from the transparent conductive film 16 by the insulating film 17.

Regarding the transparent conductive film 16, a material having high transmittance at a wavelength of the light applied from the light source 20 may be used. In particular, in the visible to near-infrared range, for example, tin-doped indium oxide (ITO), gallium-doped zinc oxide (GZO), and aluminum-doped zinc oxide (AZO) may be used. Regarding the insulating film 17, for example, silicon dioxide ($SiO_2$) may be used.

The light source 20 emits light toward the plurality of alloy nanoparticles 11 in the Schottky device 100A. Specific examples of the light source 20 include lasers, xenon lamps, mercury lamps, and halogen lamps. The light source 20 emits light having energy that is less than or equal to the band gap energy of the n-type semiconductor 12 and that corresponds to the plasmon resonance wavelength of the alloy nanoparticle 11. The light source 20 may emit light in some wavelength range. The wavelength range has to include the surface plasmon resonance wavelength of the alloy nanoparticle 11, that is, the surface plasmon resonance wavelength of the first metal 13. The light source 20 may be a constituent of the photoelectric conversion device 200A or an element outside the photoelectric conversion device 200A. When the light is applied to the Schottky device 100A from the light source 20, a current flows through the conducting wire 19.

According to the above-described configuration, natural oxidation of a metal having a low work function can be suppressed and a Schottky barrier can be lowered at a relatively low cost. As a result, a device that performs photoelectric conversion with higher efficiency can be realized.

Figure 3B:
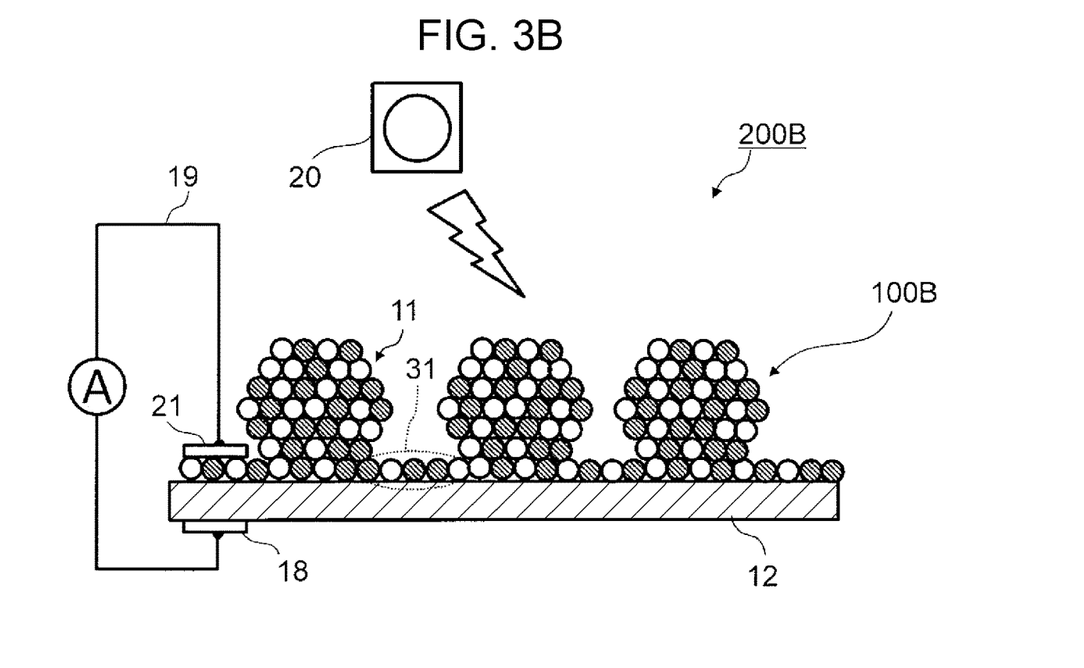
FIG. 3B is a schematic diagram showing a photoelectric conversion apparatus according to a modified example of a second embodiment.

FIG. 3B is a schematic diagram showing a photoelectric conversion apparatus 200B according to a modified example of the second embodiment. The photoelectric conversion apparatus 200B in this example includes the Schottky device 100B shown in FIG. 1B. The photoelectric conversion device 200B includes a metal film 31 and a second ohmic electrode 21 (also referred to as a second electrode) in contact with the metal film 31 instead of the insulating film 17 and the transparent conductive film 16 in the configuration shown in FIG. 3A.

The first ohmic electrode 18 is disposed on the back surface of the n-type semiconductor 12, and the second ohmic electrode 21 is disposed on the surface of the metal film 31 on the n-type semiconductor 12. The ohmic electrodes 18 and 21 are electrically connected to each other through the conducting wire 19. When the light is applied to the Schottky device 100B from the light source 20, a current flows through the conducting wire 19.

According to the above-described configuration, natural oxidation of a metal having a low work function can be suppressed and a Schottky barrier can be lowered at a relatively low cost. As a result, a device that performs photoelectric conversion with higher efficiency can be realized.

In the present embodiment, the example in which the Schottky device 100A shown in FIG. 1A is included and the example in which the Schottky device 100B shown in FIG. 1B is included are described. The photoelectric conversion apparatus is not limited to these examples. For example, the configuration of a photoelectric conversion apparatus may include any one of the Schottky devices 100C to 100E shown in FIGS. 1C to 1E, respectively. The configuration of the Schottky device is not limited to the above as long as the configuration includes a nanoparticle having an alloy portion that contains the first metal and the second metal having a lower work function than the first metal.

Third Embodiment: Fuel Production Apparatus

A fuel production apparatus including the Schottky device will be described as another example of the optical device.

Figure 3C:
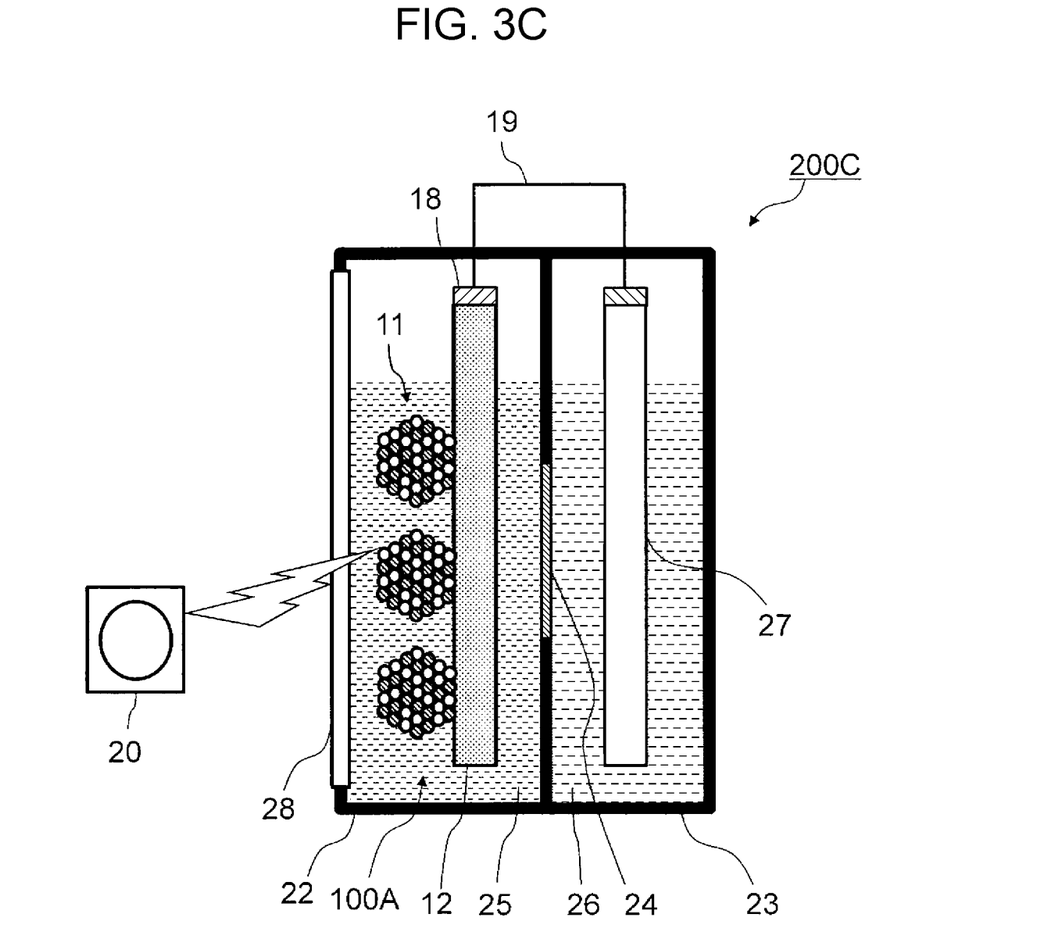
FIG. 3C is a schematic diagram showing an example of a fuel production apparatus including the Schottky device shown in FIG. 1A.

FIG. 3C is a schematic diagram showing an example of a fuel production apparatus 200C including the Schottky device 100A shown in FIG. 1A. When the light is applied from the light source 20, the fuel production apparatus 200C performs photoelectric conversion and generates a fuel by a photochemical reaction. The fuel production apparatus 200C includes an oxidation reaction vessel 22, a reduction reaction vessel 23, a proton transmission film 24, a Schottky device 100A, a reduction electrode 27, an ohmic electrode 18, a conducting wire 19, and a quartz glass window 28. A first electrolytic solution 25 is held inside the oxidation reaction vessel 22. A second electrolytic solution 26 is held inside the reduction reaction vessel 23. The oxidation reaction vessel 22 is separated from the reduction reaction vessel 23 by the proton transmission film 24. The Schottky device 100A is at least partly dipped into the first electrolytic solution 25. The reduction electrode 27 is at least partly dipped into the second electrolytic solution 26. The ohmic electrode 18 (also referred to as a first electrode) is disposed on the end portion of the n-type semiconductor 12. The first electrode 18 is electrically connected to the reduction electrode 27 (also referred to as a second electrode) through the conducting wire 19.

An example of the first electrolytic solution 25 in the oxidation reaction vessel 22 is an aqueous solution containing at least one selected from a group consisting of potassium hydrogen carbonate ($KHCO_3$), sodium hydrogen carbonate ($NaHCO_3$), potassium hydroxide (KOH), and sodium hydroxide (NaOH). The concentration of the electrolyte in the first electrolytic solution 25 may be set to be, for example, 0.1 mol/L or more. The first electrolytic solution 25 may be, for example, basic. A common electrolytic solution may be used as the second electrolytic solution 26 in the reduction reaction vessel 23. For example, an aqueous solution containing at least one selected from a group consisting of potassium hydrogen carbonate ($KHCO_3$), sodium hydrogen carbonate ($NaHCO_3$), potassium chloride (KCl), and sodium chloride (NaCl) may be used as the second electrolytic solution 26. When the second electrolytic solution contains any one of the electrolytes, the concentration of the electrolyte in the second electrolytic solution may be set to be, for example, 0.1 mol/L or more. The second electrolytic solution 26 may be, for example, acidic.

The quartz glass window 28 is disposed at the side surface of the oxidation reaction vessel 22. The light is applied by the light source 20 through the quartz glass window 28 to a region that is dipped into the first electrolytic solution 25 of the light-irradiation surface of the Schottky device 100A. Since the proton transmission film 24 is interposed between the oxidation reaction vessel 22 and the reduction reaction vessel 23, the first electrolytic solution 25 and the second electrolytic solution 26 are not mixed with each other. There is no particular limitation regarding the structure of the proton transmission film 24 as long as protons (H+) are transmitted and transmission of other substances is suppressed. Specific examples of the proton transmission film 24 include a Nafion (registered trademark) film.

The first electrode 18 may be, for example, platinum, an alloy containing platinum, or a platinum compound. When the light having energy corresponding to the surface plasmon resonance wavelength of the first metal 13 is incident on the nanoparticle 11, hydrogen is generated at the second electrode 27.

According to the above-described configuration, natural oxidation of the metal having a relatively low work function can be suppressed and the Schottky barrier can be lowered at a relatively low cost. Consequently, a device capable of performing photoelectric conversion and fuel production with higher efficiency can be realized.

The fuel production apparatus 200C according to the present embodiment may include any one of the Schottky devices 100B, 100C, 100D, and 100E shown in FIGS. 1B, 1C, 1D, and 1E, respectively, instead of the Schottky device 100A shown in FIG. 1A. The configuration of the Schottky device is not limited to the above as long as the configuration includes a nanoparticle having an alloy portion that contains the first metal and the second metal having a lower work function than the first metal.

Fourth Embodiment: Photoelectric Conversion Method

Next, an embodiment of a method for performing photoelectric conversion by using the photoelectric conversion apparatus will be described.

A photoelectric conversion method according to an aspect of the present disclosure includes the following step (a) and step (b).

Step (a): A photoelectric conversion apparatus including an n-type semiconductor and at least one alloy nanoparticle is prepared.

Step (b): At least one alloy nanoparticle is irradiated with light so as to generate a current.

In this regard, the alloy nanoparticle has an alloy portion that contains the first metal and the second metal having a lower work function than the first metal. The first metal may be selected from metals having excellent plasmonic characteristics and having a low ionization tendency. The first metal and the second metal are at least partly in a state of solid solution. That is, the first metal and the second metal constitute a solid-solution metal. Alternatively, the first metal and the second metal may constitute an intermetallic compound. The solid-solution alloy or the intermetallic compound is arranged in contact with the n-type semiconductor. Consequently, Schottky junction occurs between the alloy nanoparticle and the n-type semiconductor. For example, as shown in FIG. 3A to FIG. 3C, the alloy nanoparticles 11 are in ohmic contact with the transparent conductive film 16 (for example, a transparent conductive oxide) or the second electrode 21 containing a metal. The n-type semiconductor 12 is in ohmic contact with the first electrode 18 containing a metal. The transparent conductive film 16 or the second electrode 21 is connected to the first electrode 18 through the conducting wire 19.

According to the above-described aspect, a method in which photoelectric conversion can be efficiently performed by irradiating the alloy nanoparticles with the light having energy less than or equal to the band gap energy of the semiconductor can be provided.

The photoelectric conversion apparatus used in the present embodiment may be any one of the photoelectric conversion apparatuses 200A and 200B and the fuel production apparatus 200C. The photoelectric conversion apparatuses 200A and 200B and the fuel production apparatus 200C may be placed at, for example, room temperature and atmospheric pressure. As shown in FIGS. 3A, 3B, and 3C, the light is applied from the light source 20 to the surface provided with the alloy nanoparticles 11 of the Schottky device 100A or the Schottky device 100B. The light applied includes a wavelength that induces surface plasmon resonance of the alloy nanoparticles 11 and is less than or equal to the band gap energy of the n-type semiconductor 12. Examples of the light source 20 include lasers, xenon lamps, mercury lamps, and halogen lamps.

In the examples shown in FIGS. 3A and 3B, a current is generated by application of the light to the Schottky devices 100A and 100B. The generated current may be extracted to the outside through the conducting wire 19. The wavelength of the usable light can be controlled by adjusting the structure of the alloy nanoparticles 11 so as to control the surface plasmon resonance wavelength.

In the example shown in FIG. 3C, a fuel is generated by arranging the appropriate reduction electrode 27 into the reduction reaction vessel 23 and irradiating the Schottky device 100A with the light. As a result, for example, hydrogen ($H_2$) may be generated as a reduction product. The type of the product can be changed by selecting the type of the material for forming a catalyst layer used in the apparatus and the method according to the present disclosure. For example, in the case in which the metal or the metal compound contained in the reduction electrode 27 is platinum, a platinum alloy, or a platinum compound, hydrogen can be obtained by decomposition of water.

EXAMPLES

The examples according to the present disclosure will be described below.

Calculation of Work Function

The work function of the alloy nanoparticle in the photoelectric conversion method according to the present disclosure was evaluated by using the first-principles calculation program VASP (Vienna Ab-initio Simulation Package). Regarding each metal or alloy, the lattice constant was determined by stabilization calculation of the crystal structure and, thereafter, a vacuum slab model composed of 5 to 7 atomic layers was formulated. Regarding the vacuum slab model, a work function was calculated on the basis of the difference between the potential of a vacuum portion and Fermi energy of a slab portion. In each model, cutoff energy of a plane wave was set to be 400 eV, 0.5/Å (that is, 5/nm) of k-point mesh was used, and a GGA-PAW method was used for an exchange interaction so as to perform calculation.

Examples of the alloy nanoparticle include an alloy particle of gold (Au) having excellent plasmonic characteristics and titanium (Ti) having a low work function. In this regard, $Au_4Ti$ which is an intermetallic compound of gold (Au) and titanium (Ti) was examined as an example of the alloy nanoparticle of Au and Ti. For example, the plasmonic characteristics can be improved by including the first metal having excellent plasmonic characteristics in an amount larger than the amount of the second metal having a low work function.

Regarding $Au_4Ti$, the surface energy was compared. As a result of comparison between the (001) face and the (100) face that had the same number of atoms, it was found that the (100) face was more stable by 2.5 eV. In addition, to evaluate surface oxidation, the stability evaluation of Ti atoms exposed at the surface was performed. As a result, it was found that the stability of surface Ti atoms was low and the stability was 0.66 eV improved by removing Ti atoms from the surface. The work function of the structure in which surface Ti atoms of the $Au_4Ti$ (100) face were removed was determined to be 4.765 eV by calculation.

Next, energy calculation of Au was performed in the same manner and, as a result, the (111) face was stable. Therefore, the work function of this structure was calculated. As a result, the work function of Au was 5.305 eV. Consequently, it was ascertained that $Au_4Ti$ had a lower work function than Au by 0.5 eV or more. This can be construed that formation of a solid solution of Au with Ti having a low work function at an atomic level lowered the work function of Au. Table 1 shows the calculated work functions of $Au_4Ti$ and Au.

TABLE 1

|  | $Au_4Ti$ (100) | Au (111) |
|---|---|---|
| Work function (eV) | 4.765 | 5.305 |

Photoelectric Conversion Efficiency

According to the theory of Fowler, the photoelectric conversion efficiency η is denoted by the following formula.

$$\eta \approx C \frac{(h\nu - \varphi)^2}{h\nu} \quad (1)$$

In formula (1), C represents a constant depending on the device, Hv represents photon energy, and φ represents the Schottky barrier height. In this regard, the n-type semiconductor was set to be GaN, the photon energy was set to be 2.300 eV, and the photoelectric conversion efficiency was compared by using formula (1). The electron affinity of GaN is 3.100 eV.

Table 2 shows the result of each of the present example and a comparative example in which a structure using Au nanoparticle in the related art was provided.

TABLE 2

| Nanoparticle | Work function (eV) | n-type semiconductor | Schottky barrier height (eV) | Photoelectric conversion efficiency η |
|---|---|---|---|---|
| $Au_4Ti$ (100) | 4.765 | GaN | 1.665 | 0.1753 C |
| Au (111) | 5.305 | GaN | 2.205 | 0.003924 C |

As shown in Table 2, the photoelectric conversion efficiency η of the device using the $Au_4Ti$ nanoparticle according to the present example was 44.67 times higher than that of the device using the Au nanoparticle as a result of lowering of the Schottky barrier due to the low work function.

As described above, it was made clear that the device using the alloy nanoparticle according to the present example was very excellent at performing photoelectric conversion compared with the device using the Au nanoparticle.

Oxygen Adsorption Energy

It was indicated that the photoelectric conversion efficiency of the device was increased to a great extent by using the $Au_4Ti$ nanoparticle rather than using the Au nanoparticle for the photoelectric conversion layer. Since it is considered that, regarding $Au_4Ti$, surface Ti atoms are unstable and only Au atoms are present on the surface, it is difficult to suppose that the nanoparticle is oxidized and the surface state is changed. However, the stability of the $Au_4Ti$ nanoparticle to surface oxidation was evaluated by using the first-principles calculation so as to assess oxygen adsorption energy of the surface.

The oxygen adsorption energy was calculated by determining each of the energy of an oxygen molecule and the energy of the vacuum slab model in advance and comparing the sum of these with the energy of a stable structure in which oxygen atoms were arranged in the oxygen slab model. Regarding the calculation condition, the same condition as above was used.

The oxygen adsorption energy of the stable structure of $Au_4Ti$ was calculated and the result was −0.51 eV. This indicates that the energy in the case in which oxygen atoms are adsorbed on the slab model is higher than the energy in the case in which the slab model is present independently. Therefore, this result indicates that oxygen adsorption does not occur in practice. The oxygen adsorption energy of Au was determined under the same condition and was 0.16 eV. According to the obtained result, adsorption in the form of an oxygen atom was slightly more stable. This result is in accord with the fact that Au is not readily oxidized even when being left standing in air.

Further, for the purpose of comparison, the oxygen adsorption energy of the Ti metal was also calculated. The result of calculation was 5.09 eV regarding the most stable (111) face. It was shown that the Ti metal exhibited an order of magnitude greater value than the values of the above-described two metal alloys. This result is in accord with the fact that Ti is readily oxidized by being exposed to air. Table 3 shows the oxygen adsorption energy of each of Au$_4$Ti and Ti.

TABLE 3

|  | Au$_4$Ti (100) | Ti (111) |
| --- | --- | --- |
| Oxygen adsorption energy (eV) | −0.51 | 5.09 |

Consequently, it was made clear that Au$_4$Ti that was an example of the alloy nanoparticle according to the present disclosure had particularly excellent oxidation resistance (that is, instability to oxygen adsorption) compared with the Ti simple substance in the related art. This is conjectured to be the result of Ti atoms entering Au atoms and electrons of Ti, which had a highly cationic property, penetrating Au.

As described above, the optical device according to an embodiment of the present disclosure includes the intermetallic compound of the first metal and the second metal having a lower work function than the first metal or a solid-solution alloy of the first metal and the second metal and includes the n-type semiconductor in Schottky junction with the intermetallic compound or the solid-solution alloy. According to the above-described configuration, since the first metal and the second metal form the intermetallic compound or the solid-solution alloy, natural oxidation of the second metal having a relatively low work function can be suppressed. In addition, since the intermetallic compound or the solid-solution alloy is used, the cost can be reduced compared with the case in which the first metal and the second metal are disposed separately by using micromachining.

The first metal may be at least one metal selected from a group consisting of gold (Au), silver (Ag), copper (Cu), and aluminum (Al). The second metal may be at least one metal selected from a group consisting of titanium (Ti), chromium (Cr), silver (Ag), copper (Cu), aluminum (Al), nickel (Ni), manganese (Mn), iron (Fe), zinc (Zn), gallium (Ga), and tantalum (Ta).

According to this configuration, the first metal having excellent plasmonic characteristics is used and, therefore, the plasmonic characteristics of the nanoparticle can be improved.

The amount of the first metal contained in the intermetallic compound or the solid-solution alloy may be larger than the amount of the second metal contained in the intermetallic compound or the solid-solution alloy.

According to this configuration, the plasmonic characteristics of the nanoparticle can be further improved by the first metal having a large amount.

The intermetallic compound or the solid-solution alloy may be Au$_4$Ti.

According to this configuration, the photoelectric conversion efficiency can be increased to a great extent.

The n-type semiconductor may be an inorganic semiconductor.

The intermetallic compound or the solid-solution alloy may have a comb-like structure.

The optical device may further include at least one nanoparticle. The intermetallic compound or the solid-solution alloy may be contained in the at least one nanoparticle.

The particle diameter of the at least one nanoparticle may be 1 nm or more and 200 nm or less.

Plasmon absorption can be improved by setting the particle diameter to be 200 nm or less.

The at least one nanoparticle may be a plurality of nanoparticles. The optical device may further include a metal film that electrically connects the plurality of nanoparticles to each other.

According to this configuration, the photoelectric conversion efficiency can be further increased because the plurality of nanoparticles are disposed.

The metal film may contain the first metal and the second metal.

The metal layer may cover at least part of the surface of the n-type semiconductor.

Each of the at least one nanoparticle may have a cavity surrounded by the intermetallic compound or the solid-solution alloy.

According to this configuration, the surface plasmon resonance wavelength can be increased by an interaction between the inner shell (that is, the cavity) and surface plasmon of the outer shell (that is, the intermetallic compound or the solid-solution alloy).

Each of the at least one nanoparticle may include a core portion composed of one selected from a group consisting of gold (Au), silver (Ag), copper (Cu), aluminum (Al), a polymer material, and silica. The intermetallic compound or the solid-solution alloy may cover at least part of the core portion.

In the case in which the core portion contains a polymer material or silica, the surface plasmon resonance wavelength can be increased by an interaction between the inner shell (that is, the core portion) and surface plasmon of the outer shell (that is, the intermetallic compound or the solid-solution alloy). Meanwhile, in the case in which the core portion contains gold, silver, copper, or aluminum, the plasmonic characteristics of the nanoparticle can be further improved.

The core portion may be substantially composed of gold (Au), silver (Ag), copper (Cu), aluminum (Al), a polymer material, or silica.

The intermetallic compound or the solid-solution alloy may cover the entire core portion.

In each of the at least one nanoparticle, the intermetallic compound or the solid-solution alloy may be separated into a plurality of portions. The plurality of portions may be distributed, around the core portion, with a gap interposed therebetween.

The optical device may further include a light source which emits light having energy that is lower than or equal to the band gap energy of the n-type semiconductor and that corresponds to the plasmon resonance wavelength of the at least one nanoparticle.

The n-type semiconductor may contain at least one selected from a group consisting of a silicon semiconductor, a germanium semiconductor, and a gallium arsenide semiconductor. The surface plasmon resonance wavelength of the at least one nanoparticle may be 900 nm or more.

The n-type semiconductor may contain at least one selected from a group consisting of a titanium oxide (TiO$_2$) semiconductor, a gallium nitride (GaN) semiconductor, and a strontium titanate (SrTiO$_3$) semiconductor. The surface plasmon resonance wavelength of the at least one nanoparticle may be 400 nm or more.

A photoelectric conversion apparatus according to an embodiment of the present disclosure includes any one of the above-described optical devices, a first electrode, and a conducting wire that electrically connects the first electrode to the intermetallic compound or the solid-solution alloy. The n-type semiconductor has a first surface facing the intermetallic compound or the solid-solution alloy and a second surface opposite to the first surface. The first electrode is in contact with the second surface of the n-type semiconductor.

The above-described photoelectric conversion apparatus may further include an insulating film disposed on the first surface of the n-type semiconductor and a transparent conductive film covering the insulating film and the intermetallic compound or the solid-solution alloy. The transparent conductive film may be in no contact with the n-type semiconductor. The conducting wire may electrically connect the first electrode to the transparent conductive film.

The optical device may include a plurality of nanoparticles containing the intermetallic compound or the solid-solution alloy, a metal film that is disposed on the first surface of the n-type semiconductor and that electrically connects the plurality of nanoparticles to each other, and a second electrode in contact with the metal film. The conducting wire may electrically connect the first electrode to the second electrode.

According to this configuration, the photoelectric conversion efficiency can be further increased because the plurality of nanoparticles are disposed.

A fuel production apparatus according to an embodiment of the present disclosure includes any one of the above-described optical devices, a first electrode in contact with the n-type semiconductor in the optical device, an oxidation reaction vessel that contains a first electrolytic solution and the optical device, a reduction reaction vessel that contains a second electrolytic solution and a second electrode, a proton transmission film located at a border between the oxidation reaction vessel and the reduction reaction vessel, and a conducting wire that connects the first electrode to the second electrode. The optical device is in contact with the first electrolytic solution. The second electrode is in contact with the second electrolytic solution.

The first electrode may be platinum, an alloy containing platinum, or a platinum compound. When light having energy corresponding to the surface plasmon resonance wavelength of the first metal is incident on the intermetallic compound or the solid-solution alloy in the optical device, hydrogen may be generated at the second electrode.

According to this configuration, hydrogen can be obtained through water decomposition by using the first electrode containing platinum.

The first electrolytic solution may be an aqueous solution containing at least one selected from a group consisting of potassium hydrogen carbonate ($KHCO_3$), sodium hydrogen carbonate ($NaHCO_3$), potassium hydroxide (KOH), and sodium hydroxide (NaOH).

The second electrolytic solution may be an aqueous solution containing at least one selected from a group consisting of potassium hydrogen carbonate ($KHCO_3$), sodium hydrogen carbonate ($NaHCO_3$), potassium chloride (KCl), and sodium chloride (NaCl).

The technology according to the present disclosure may be exploited for any application in which photoelectric conversion is performed. For example, the technology may be exploited for photodetectors such as an image sensor and fuel production apparatuses.

What is claimed is:
1. An optical device comprising:
an intermetallic compound of a first metal and a second metal having a lower work function than the first metal, or a solid-solution alloy of the first metal and the second metal; and
an n-type semiconductor in Schottky junction with the intermetallic compound or the solid-solution alloy,
wherein the optical device detects near-infrared light, and
wherein the amount of the first metal contained in the intermetallic compound or the solid-solution alloy is larger than the amount of the second metal contained in the intermetallic compound or the solid-solution alloy.

2. The optical device according to claim 1,
wherein an energy of the near-infrared light is lower than a band gap energy of the n-type semiconductor.

3. The optical device according to claim 1,
wherein the n-type semiconductor is a silicon (Si) semiconductor.

4. The optical device according to claim 1,
wherein the height of the Schottky barrier of the Schottky junction is lower than the energy of the near-infrared light.

5. The optical device according to claim 1,
wherein the first metal is at least one metal selected from a group consisting of gold (Au), silver (Ag), copper (Cu), and aluminum (Al), and
the second metal is at least one metal selected from a group consisting of titanium (Ti), chromium (Cr), silver (Ag), copper (Cu), aluminum (Al), nickel (Ni), manganese (Mn), iron (Fe), zinc (Zn), gallium (Ga), and tantalum (Ta).

6. The optical device according to claim 1,
wherein the intermetallic compound or the solid-solution alloy is $Au_4Ti$.

7. The optical device according to claim 1,
wherein the n-type semiconductor is an inorganic semiconductor.

8. The optical device according to claim 1,
wherein the intermetallic compound or the solid-solution alloy has a comb-like structure.

9. The optical device according to claim 1, further comprising at least one nanoparticle,
wherein the intermetallic compound or the solid-solution alloy is contained in the at least one nanoparticle.

10. The optical device according to claim 9,
wherein a particle diameter of each of the at least one nanoparticle is 1 nm or more and 200 nm or less.

11. The optical device according to claim 9, further including a metal film,
wherein the at least one nanoparticle is a plurality of nanoparticles, and
the metal film electrically connects the plurality of nanoparticles to each other.

12. The optical device according to claim 11,
wherein the metal film contains the first metal and the second metal.

13. The optical device according to claim 11,
wherein the metal layer covers at least part of a surface of the n-type semiconductor.

14. The optical device according to claim 9,
wherein each of the at least one nanoparticle has a cavity surrounded by the intermetallic compound or the solid-solution alloy.

15. The optical device according to claim 9,
wherein each of the at least one nanoparticle includes a core portion including at least one selected from a group consisting of gold (Au), silver (Ag), copper (Cu) aluminum (Al), a polymer material, and silica, and
in each of the at least one nanoparticle, the intermetallic compound or the solid-solution alloy covers at least part of the core portion.

16. The optical device according to claim 15, wherein the core portion is substantially composed of gold (Au), silver (Ag), copper (Cu), aluminum (Al), a polymer material, or silica.

17. The optical device according to claim 15, wherein in each of the at least one nanoparticle, the intermetallic compound or the solid-solution alloy covers the entire core portion.

18. The optical device according to claim 15, wherein in each of the at least one nanoparticle, the intermetallic compound or the solid-solution alloy is separated into a plurality of portions, and the plurality of portions are distributed, around the core portion, with a gap between the plurality of portions.

19. The optical device according to claim 9, further comprising a light source which emits light having energy that is lower than or equal to a band gap energy of the n-type semiconductor and that corresponds to a plasmon resonance wavelength of the at least one nanoparticle.

20. The optical device according to claim 9, wherein the n-type semiconductor contains at least one selected from a group consisting of a silicon semiconductor, a germanium semiconductor, and a gallium arsenide semiconductor, and a surface plasmon resonance wavelength of the at least one nanoparticle is 900 nm or more.

21. The optical device according to claim 9, wherein the n-type semiconductor contains at least one selected from a group consisting of a titanium oxide ($TiO_2$) semiconductor, a gallium nitride (GaN) semiconductor, and a strontium titanate ($SrTiO_3$) semiconductor, and a surface plasmon resonance wavelength of the at least one nanoparticle is 400 nm or more.

22. A photoelectric conversion apparatus comprising: an optical device according to claim 1; a first electrode; and a conducting wire that electrically connects the first electrode to the intermetallic compound or the solid-solution alloy, wherein the n-type semiconductor has a first surface facing the intermetallic compound or the solid-solution alloy and a second surface opposite to the first surface, and the first electrode is in contact with the second surface of the n-type semiconductor.

23. The photoelectric conversion apparatus according to claim 22, further comprising: an insulating film disposed on the first surface of the n-type semiconductor; and a transparent conductive film covering the insulating film and the intermetallic compound or the solid-solution alloy, wherein the transparent conductive film is not in contact with the n-type semiconductor, and the conducting wire electrically connects the first electrode to the transparent conductive film.

24. The photoelectric conversion apparatus according to claim 22, wherein the optical device includes: a plurality of nanoparticles containing the intermetallic compound or the solid-solution alloy; a metal film that is disposed on the first surface of the n-type semiconductor and that electrically connects the plurality of nanoparticles to each other; and a second electrode in contact with the metal film, and the conducting wire electrically connects the first electrode to the second electrode.

25. A fuel production apparatus comprising: an optical device according to claim 1; a first electrode in contact with the n-type semiconductor in the optical device; an oxidation reaction vessel that contains a first electrolytic solution and the optical device; a reduction reaction vessel that contains a second electrolytic solution and a second electrode; a proton transmission film located at a border between the oxidation reaction vessel and the reduction reaction vessel; and a conducting wire that connects the first electrode to the second electrode, wherein the optical device is in contact with the first electrolytic solution, and the second electrode is in contact with the second electrolytic solution.

26. The fuel production apparatus according to claim 25, wherein the first electrode is platinum, an alloy containing platinum, or a platinum compound, and when light having energy corresponding to a surface plasmon resonance wavelength of the first metal is incident on the intermetallic compound or the solid-solution alloy in the optical device, hydrogen is generated at the second electrode.

27. The fuel production apparatus according to claim 25, wherein the first electrolytic solution is an aqueous solution containing at least one selected from a group consisting of potassium hydrogen carbonate ($KHCO_3$), sodium hydrogen carbonate ($NaHCO_3$), potassium hydroxide (KOH), and sodium hydroxide (NaOH).

28. The fuel production apparatus according to claim 25, wherein the second electrolytic solution is an aqueous solution containing at least one selected from a group consisting of potassium hydrogen carbonate ($KHCO_3$), sodium hydrogen carbonate ($NaHCO_3$), potassium chloride (KCl), and sodium chloride (NaCl).

29. The optical device according to claim 1, comprising the intermetallic compound of the first metal and the second metal having a lower work function than the first metal.

30. The optical device according to claim 1, wherein the first metal has plasmonic characteristics.

31. The optical device according to claim 30, wherein the plasmonic characteristics of the first metal are larger than plasmonic characteristics of the second metal.

* * * * *